United States Patent
Lee et al.

(10) Patent No.: US 9,306,071 B2
(45) Date of Patent: Apr. 5, 2016

(54) ORGANIC LIGHT-EMITTING DISPLAY DEVICE INCLUDING A FLEXIBLE TFT SUBSTRATE AND STACKED BARRIER LAYERS

(71) Applicant: SAMSUNG DISPLAY CO., LTD., Yongin, Gyeonggi-Do (KR)

(72) Inventors: Jae-Seob Lee, Yongin (KR); Dong-Un Jin, Yongin (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 0 days.

(21) Appl. No.: 14/161,474

(22) Filed: Jan. 22, 2014

(65) Prior Publication Data
US 2014/0209877 A1 Jul. 31, 2014

(30) Foreign Application Priority Data
Jan. 30, 2013 (KR) .......................... 10-2013-0010721

(51) Int. Cl.
*H01L 29/786* (2006.01)
*H01L 27/12* (2006.01)
*H01L 51/00* (2006.01)

(52) U.S. Cl.
CPC ...... *H01L 29/78603* (2013.01); *H01L 27/1218* (2013.01); *H01L 51/0097* (2013.01)

(58) Field of Classification Search
CPC ...................... H01L 29/78603; H01L 29/0097
USPC ............................................ 257/40, 340, 347
See application file for complete search history.

(56) References Cited

U.S. PATENT DOCUMENTS

| 5,376,733 | A | 12/1994 | Okinoshima et al. | |
|---|---|---|---|---|
| 6,413,645 | B1 * | 7/2002 | Graff et al. ................... | 428/446 |
| 7,868,327 | B2 | 1/2011 | Jeong et al. | |
| 2007/0108472 | A1 * | 5/2007 | Jeong ................ | H01L 29/66757 257/192 |
| 2008/0284719 | A1 * | 11/2008 | Yoshida ........................ | 345/102 |
| 2008/0318034 | A1 | 12/2008 | Murakami et al. | |
| 2011/0134018 | A1 | 6/2011 | Seo et al. | |
| 2011/0193067 | A1 * | 8/2011 | Lee et al. ......................... | 257/40 |
| 2012/0034451 | A1 * | 2/2012 | Seo ........................ | C23C 16/345 428/332 |

FOREIGN PATENT DOCUMENTS

| JP | 1995-026948 | 10/1995 |
|---|---|---|
| JP | 2007-142367 | 6/2007 |
| JP | 2008-307887 | 12/2008 |

(Continued)

OTHER PUBLICATIONS

U.S. Pat. No. 5,376,733 (For KR-1995-026948A).
US Patent Application Publication No. 2008/0318034 (For JP2008-307887A).
US Patent Application Publication No. 2011/0134018 (For KR10-2011-0062382A).

*Primary Examiner* — Marc Armand
*Assistant Examiner* — Christina Sylvia
(74) *Attorney, Agent, or Firm* — F. Chau & Associates, LLC

(57) ABSTRACT

A thin-film transistor (TFT) substrate includes a flexible substrate. A first barrier layer is formed on the flexible substrate. The first barrier layer includes a first silicon oxide layer and a first silicon nitride layer. A second barrier layer is formed on the first barrier layer. The second barrier layer includes a second silicon oxide layer and a second silicon nitride layer. A TFT layer is formed on the second barrier layer. The second silicon oxide layer is disposed adjacent to the TFT layer.

10 Claims, 5 Drawing Sheets

(56) References Cited

FOREIGN PATENT DOCUMENTS

| KR | 1020060075644 | 7/2006 |
| KR | 10-2011-0062382 | 6/2011 |
| KR | 10-2011-0074254 | 6/2011 |
| KR | 10-1056431 | 8/2011 |
| KR | 1020120073904 | 7/2012 |
| KR | 10-2012-0133952 | 12/2012 |

* cited by examiner

ORGANIC LIGHT-EMITTING DISPLAY DEVICE INCLUDING A FLEXIBLE TFT SUBSTRATE AND STACKED BARRIER LAYERS

CROSS-REFERENCE TO RELATED PATENT APPLICATION

This application claims priority to Korean Patent Application No. 10-2013-0010721, filed on Jan. 30, 2013, in the Korean Intellectual Property Office, the disclosure of which is incorporated by reference herein in its entirety.

TECHNICAL FIELD

Exemplary embodiments of the present invention relate to displays, and more specifically, to a thin-film transistor (TFT) substrate including a barrier layer including silicon oxide and silicon nitride, an organic light-emitting display device including the TFT substrate, and a method of manufacturing the TFT substrate.

DISCUSSION OF THE RELATED ART

A flexible display is manufactured by using a flexible substrate formed of a flexible material such as plastic. Thin-film transistors (TFTs) are formed on the flexible substrate to generate electrical signals to control the operation of each pixel. Barriers may be disposed between the TFTs and the flexible substrate to electrically isolate the TFTs. However, the barriers may peel off from the flexible substrate, and the operation of the TFTs may deteriorate.

SUMMARY

According to an exemplary embodiment of the present invention, a thin-film transistor (TFT) substrate includes a flexible substrate. A first barrier layer is formed on the flexible substrate. The first barrier layer includes a first silicon oxide layer and a first silicon nitride layer. A second barrier layer is formed on the first barrier layer. The second barrier layer includes a second silicon oxide layer and a second silicon nitride layer. A TFT layer is formed on the second barrier layer. The second silicon oxide layer is disposed adjacent to the TFT layer.

The first silicon nitride layer and the second silicon nitride layer may be disposed adjacent to each other.

The TFT substrate may further include a silicon oxynitride layer between the first silicon nitride layer and the second silicon nitride layer.

The first silicon oxide layer of the first barrier layer may be stacked on the flexible substrate. The first silicon nitride layer of the first barrier layer may be stacked on the first silicon oxide layer.

The TFT substrate may further include a silicon oxide layer between the first silicon nitride layer and the second silicon nitride layer.

The TFT substrate may further include a silicon nitride layer between the flexible substrate and the first silicon oxide layer.

The TFT substrate may further include a silicon oxynitride layer between the first silicon nitride layer and the second silicon nitride layer.

The TFT substrate may further include a silicon oxide layer. The silicon oxide layer is disposed between the first silicon nitride layer and the second silicon nitride layer. A silicon nitride layer is disposed between the flexible substrate and the first silicon oxide layer.

The TFT substrate may further include a silicon oxide layer and a silicon nitride layer between the flexible substrate and the first silicon oxide layer.

The silicon oxide layer may be stacked on the flexible substrate. The silicon nitride layer may be stacked on the silicon oxide layer.

The TFT substrate may further include a silicon oxynitride layer disposed between the first silicon nitride layer and the second silicon nitride layer.

Each of the first and second barrier layers may further include one or more silicon oxide layers and one or more silicon nitride layers.

A total thickness of the first and second silicon nitride layers included in the first barrier layer, and the second barrier layer may be less than a total thickness of the first and second silicon oxide layers included in the first barrier layer and the second barrier layer.

According to an exemplary embodiment of the present invention, an organic light-emitting display device includes a flexible substrate. A first barrier layer is formed on the flexible substrate. The first barrier layer includes a first silicon oxide layer and a first silicon nitride layer. A second barrier layer is formed on the first barrier layer. The second barrier layer includes a second silicon oxide layer and a second silicon nitride layer. A thin-film transistor (TFT) is formed on the second barrier layer. An organic light-emitting layer is formed on the second barrier layer. The organic light-emitting layer is connected to the TFT. The first silicon oxide layer of the first barrier layer is disposed on the flexible substrate, and the first silicon nitride layer is disposed on the first silicon oxide layer. The second silicon nitride layer of the second barrier layer is disposed on the first barrier layer, and the second silicon oxide layer is disposed on the second silicon nitride layer.

The organic light-emitting display device may further include a silicon oxynitride layer between the first silicon nitride layer and the second silicon nitride layer.

The organic light-emitting display device may further include a silicon nitride layer the flexible substrate and the first silicon oxide layer.

According to an exemplary embodiment of the present invention, a method of manufacturing a thin-film transistor (TFT) substrate includes forming a first barrier layer on a plastic film. The first barrier layer includes a first silicon oxide layer and a first silicon nitride layer. A TFT and a second barrier layer are formed on the first barrier layer. The second barrier layer includes a second silicon oxide layer and a second silicon nitride layer. The second silicon oxide layer is positioned adjacent to the TFT. The first barrier layer is formed in a first process chamber, and the TFT and the second barrier layer are formed in a second process chamber different from the first process chamber.

The first process chamber and the second process chamber may have different degrees of vacuum from each other.

The method may further include preheating the plastic film before the first process.

A preheating time of the plastic film may be longer when the first silicon nitride layer is directly formed on the plastic film than when the first silicon oxide layer is directly formed on the plastic film.

According to an exemplary embodiment of the present invention, a method of manufacturing a thin-film transistor (TFT) substrate comprises heating a flexible substrate for a predetermined time. A first silicon nitride layer, a first silicon oxide layer, a second silicon nitride layer, and a second silicon oxide layer are sequentially formed on the flexible substrate.

BRIEF DESCRIPTION OF THE DRAWINGS

A more complete appreciation of the present disclosure and many of the attendant aspects thereof will be readily obtained as the same becomes better understood by reference to the following detailed description when considered in connection with the accompanying drawings, wherein.

DETAILED DESCRIPTION OF EMBODIMENTS

Figure 1:
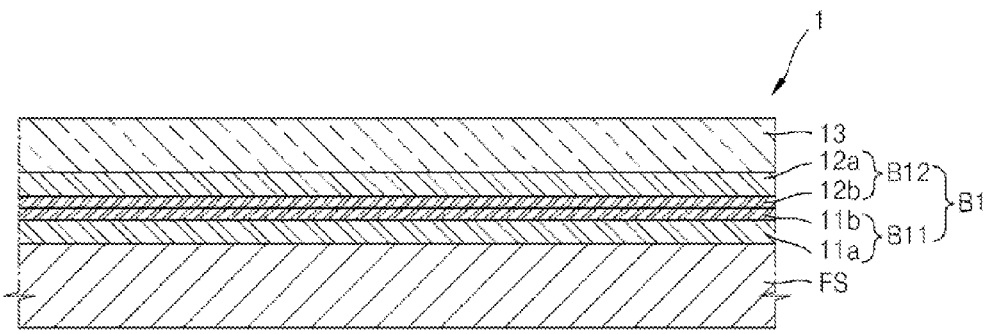
FIG. 1 is a cross-sectional view illustrating a thin-film transistor (TFT) substrate according to an exemplary embodiment of the present invention.

Exemplary embodiments of the present invention will now be described in more detail with reference to the accompanying drawings. The invention may, however, be embodied in many different forms and should not be construed as being limited to the embodiments set forth herein.

Like reference numerals may denote like or similar elements throughout the specification and the drawings. It will be understood that when an element or layer is referred to as being "on," "connected to," "coupled to," or "adjacent to" another element or layer, it can be directly on, connected, coupled, or adjacent to the other element or layer, or intervening elements or layers may be present. As used herein, the singular forms "a," "an," and "the" are intended to include the plural forms as well, unless the context clearly indicates otherwise.

FIG. 1 is a cross-sectional view illustrating a thin-film transistor (TFT) substrate 1 according to an exemplary embodiment of the present invention.

Referring to FIG. 1, the TFT substrate 1 includes a flexible substrate FS, a first barrier layer B11, a second barrier layer B12, and a TFT layer 13.

The flexible substrate FS may be formed of plastic having high thermal resistance and high durability, such as polyethylene ether phthalate, polyethylene naphthalate, polycarbonate, polyacrylate, polyetherimide, polyethersulfone, and/or polyimide.

When heat is applied to the flexible substrate FS formed of plastic, the flexible substrate FS may be bent or stretched. Accordingly, a thin-film pattern such as a conductive wiring or various electrodes might not be precisely formed on the flexible substrate FS. Accordingly, a process for forming a thin-film pattern is performed with the flexible substrate FS adhered to a glass substrate. Next, the first barrier layer B11 and the second barrier layer B12 are formed on the flexible substrate FS, and the TFT layer 13 including a driving circuit unit is formed on the second barrier layer B12. After a display unit such as an organic light-emitting device (OLED) is formed, an encapsulation thin film that encapsulates the display unit and the driving circuit unit is formed, thus forming a display panel. Once the display panel is formed, the glass substrate is separated from the flexible substrate FS.

Since the flexible substrate FS has a higher water vapor transmission rate than the glass substrate, the lifetime of the OLED may be reduced. To prevent moisture and impurities from penetrating into the flexible substrate FS, the first barrier layer B11 and the second barrier layer B12 are formed on the flexible substrate FS.

The first barrier layer B11 includes a first silicon oxide layer 11a and a first silicon nitride layer 11b.

The first silicon oxide layer 11a and the first silicon nitride layer 11b may be manufactured by using chemical vapor deposition (CVD), plasma-enhanced chemical vapor deposition (PECVD), or atomic layer deposition (ALD).

The first silicon oxide layer 11a is formed on the flexible substrate FS, and then the first silicon nitride layer 11b is formed on the first silicon oxide layer 11a. Since an adhesive force between the first silicon oxide layer 11a and the flexible substrate FS is higher than an adhesive force between the first silicon nitride layer 11b and the flexible substrate FS, the first barrier layer B11 may be prevented from peeling off from the flexible substrate FS by first depositing the first silicon oxide layer 11a on the flexible substrate FS.

The second barrier layer B12 includes a second silicon oxide layer 12a and a second silicon nitride layer 12b.

The second silicon oxide layer 12a and the second silicon nitride layer 12b may be manufactured by using CVD, PECVD, or ALD.

The second barrier layer B12 is formed by forming the second silicon nitride layer 12b on the first barrier layer B11 and then forming the second silicon oxide layer 12a on the second silicon nitride layer 12b. Characteristics of a TFT may be deteriorated by a defect site that occurs due to hydrogen included in the second silicon nitride layer 12b. The deterioration of characteristics of the TFT may be prevented by making the second silicon oxide layer 12a positioned adjacent to the TFT layer 13.

Each of the first silicon nitride layer 11b, the first silicon oxide layer 11a, the second silicon nitride layer 12b, and the second silicon oxide layer 12a may be formed to a thickness of about 1 nm to about 1000 nm. Since the characteristics of the TFT may be deteriorated by a silicon nitride, the first silicon nitride layer 11b may be thinner than the first silicon oxide layer 11a, and the second silicon nitride layer 12b may be thinner than the second silicon oxide layer 12a. A total thickness of the first silicon nitride layer 11b and the second silicon nitride layer 12b may be less than a total thickness of the first silicon oxide layer 11a and the second silicon oxide layer 12a.

A whole barrier layer B1 has a 4-layer structure that includes a silicon oxide layer, a silicon nitride layer, a silicon nitride layer, and a silicon oxide layer that are sequentially disposed on the flexible substrate FS.

The first barrier layer B11 and the second barrier layer B12 may reduce a water vapor transmission rate of the flexible substrate FS and may prevent impurities from penetrating into the TFT layer 13 from the flexible substrate FS. Due to an increase in an adhesive force to the flexible substrate FS, the barrier layer B1 may be prevented from peeling off and the characteristics of a TFT may be prevented from deteriorating.

Figure 2:
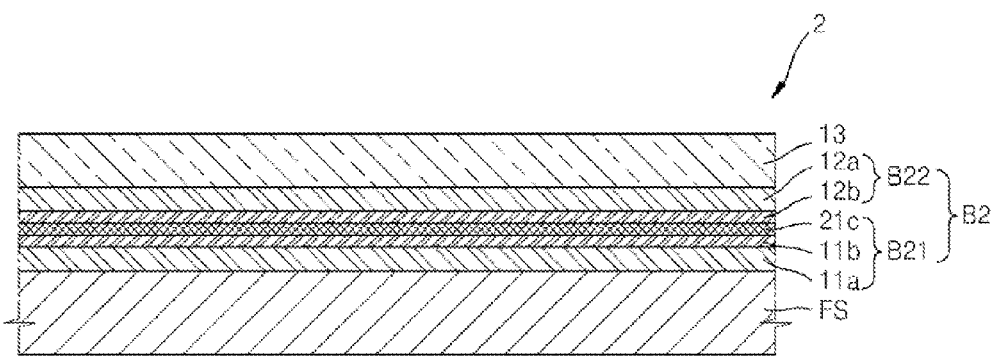
FIG. 2 is a cross-sectional view illustrating a TFT substrate according to an exemplary embodiment of the present invention.

FIG. 2 is a cross-sectional view illustrating a TFT substrate 2 according to an exemplary embodiment of the present invention.

Referring to FIG. 2, the TFT substrate 2 includes a flexible substrate FS, a first barrier layer B21, a second barrier layer B22, a TFT layer 13, and a first silicon oxynitride layer 21c.

The first barrier layer B21 includes a first silicon oxide layer 11a, a first silicon nitride layer 11b, and a first silicon oxynitride layer 21c. Since the first silicon oxide layer 11a having a higher adhesive force than the first silicon nitride layer 11b is first formed on the flexible substrate FS, the first barrier layer B21 may be prevented from peeling off from the flexible substrate FS.

The second barrier layer B22 includes a second silicon oxide layer 12a and a second silicon nitride layer 12b. The characteristics of a TFT included in the TFT layer 13 may be prevented from being deteriorated by making the second silicon oxide layer 12a positioned adjacent to the TFT layer 13.

The first silicon oxynitride layer 21c is formed between the first silicon nitride layer 11b of the first barrier layer B21 and the second silicon nitride layer 12b of the second barrier layer B22. A plurality of silicon nitride layers and silicon oxide layers constituting the first barrier layer B21 and the second barrier layer B22 may be deposited in substantially the same process chamber or different process chambers. For example, when a non-continuous process of forming the first barrier layer B21 on the flexible substrate FS in a first process chamber and forming the second barrier layer B22 in a second process chamber is performed, a surface of the silicon nitride layer 11b that is an uppermost layer of the first barrier layer B21 is oxidized. For example, the first silicon oxynitride layer 21c is formed on the silicon nitride layer 11b that is an uppermost layer of the first barrier layer B11. Since the first silicon oxynitride layer 21c may control moisture, a water vapor transmission rate of the TFT substrate 2 may be reduced. The first process chamber and the second process chamber have different degrees of vacuum from each other.

Figure 3:
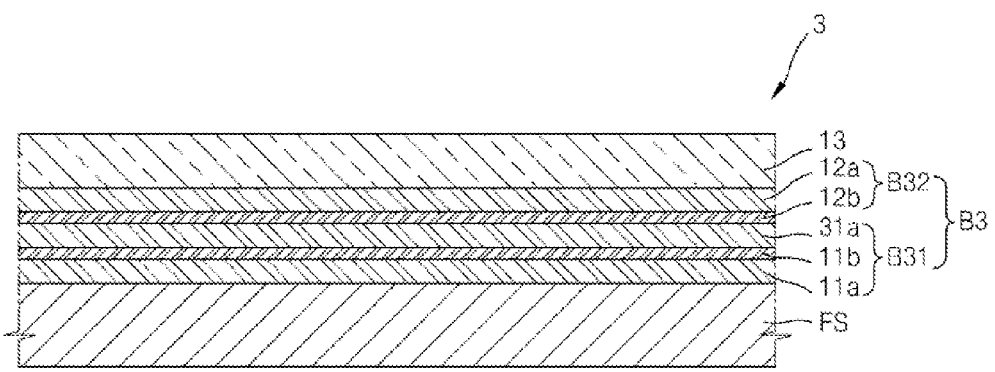
FIG. 3 is a cross-sectional view illustrating a TFT substrate according to an exemplary embodiment of the present invention.

FIG. 3 is a cross-sectional view illustrating a TFT substrate 3 according to an exemplary embodiment of the present invention.

Referring to FIG. 3, the TFT substrate 3 includes a flexible substrate FS, a first barrier layer B31, a second barrier layer B32, and the TFT layer 13.

The first barrier B31 includes a first silicon oxide layer 11a, a first silicon nitride layer 11b, and a third silicon oxide layer 31a. Since the first silicon oxide layer 11a having a higher adhesive force than the first silicon nitride layer 11b is formed on the flexible substrate FS, the first barrier layer B11 may be prevented from peeling off from the flexible substrate FS. A water vapor transmission rate of the TFT substrate 3 may be reduced by forming the third silicon oxide layer 31a as an uppermost layer of the first barrier layer B31 to increase a total thickness of the first barrier layer B31. The third silicon oxide layer 31a may be formed of substantially the same component as the first silicon oxide layer 11a. The third silicon oxide layer 31a may have substantially the same thickness as the first silicon oxide layer 11a.

The second barrier layer B32 includes a second silicon oxide layer 12a and a second silicon nitride layer 12b. The characteristics of a TFT included in the TFT layer 13 may be prevented from being deteriorated by making the second silicon oxide layer 12a positioned adjacent to the TFT layer 13.

A barrier layer B3 has a 5-layer structure that includes a silicon oxide layer, a silicon nitride layer, a silicon oxide layer, a silicon nitride layer, and a silicon oxide layer that are sequentially disposed on the flexible substrate FS.

Figure 4:
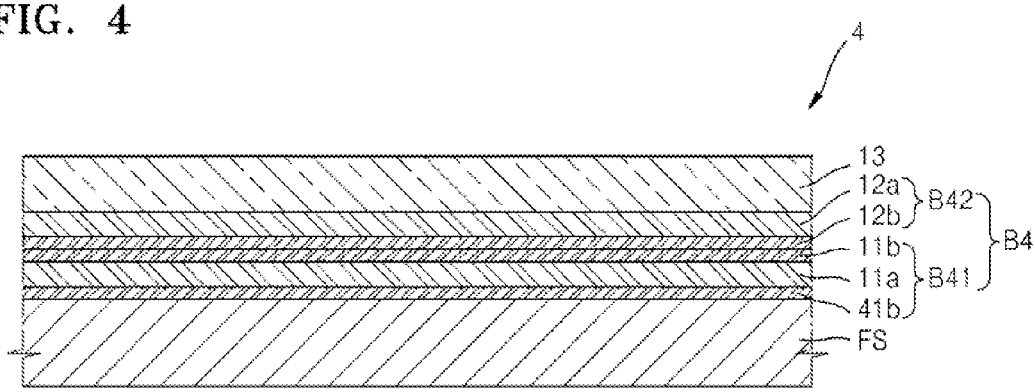
FIG. 4 is a cross-sectional view illustrating a TFT substrate according to an exemplary embodiment of the present invention.

FIG. 4 is a cross-sectional view illustrating a TFT substrate 4 according to an exemplary embodiment of the present invention.

Referring to FIG. 4, the TFT substrate 4 includes a flexible substrate FS, a first barrier layer B41, a second barrier layer B42, and a TFT layer 13.

The first barrier layer B41 includes a third silicon nitride layer 41b, a first silicon oxide layer 11a, and a first silicon nitride layer 11b.

An adhesive force between the plastic substrate and the silicon nitride layer may be increased by increasing a preheating time of the plastic substrate. For example, in a case where a plastic substrate including polyimide is formed on a glass substrate and is cured and cleaned, and the plastic substrate is preheated in a preheating chamber at about 250° C. to about 450° C., and silicon nitride and silicon oxide are deposited on the plastic substrate at about 400° by using PECVD, 1) when the plastic substrate is preheated for about 50 seconds in a preheating chamber and then the silicon oxide and silicon nitride layers are sequentially deposited on the plastic substrate, an adhesive strength between the plastic substrate and the silicon oxide layer is about 5.5 N/cm, and 2) when the plastic substrate is preheated in the preheating chamber and then the silicon nitride layer and the silicon oxide layer are sequentially deposited on the plastic substrate, an adhesive strength between the plastic substrate and the silicon nitride layer is about 4.3 N/cm. However, 3) when the plastic substrate is preheated in the preheating chamber for about 400 seconds and the silicon nitride layer and the silicon oxide layer are sequentially deposited on the plastic substrate, an adhesive strength between the plastic substrate and the silicon nitride layer is about 6.1 N/cm. Accordingly, an adhesive force between a silicon nitride and a plastic substrate may be increased by increasing a preheating time of the plastic substrate.

According to an exemplary embodiment of the present invention, the third silicon nitride layer 41b is formed on the flexible substrate FS, and then, the first silicon oxide layer 11a is formed on the third silicon nitride layer 41b. The first barrier layer B41 may be prevented from peeling off by increasing an adhesive force between the flexible substrate FS and the third silicon nitride layer 41b by increasing a preheating time of the flexible substrate FS. The third silicon nitride layer 41b may be formed of substantially the same component as the first silicon nitride layer 11a. The third silicon nitride layer 41b may have substantially the same thickness as the first silicon nitride layer 11a.

The second barrier layer B42 includes the second silicon oxide layer 12a and the second silicon nitride layer 12b. The characteristics of a TFT included in the TFT layer 13 may be prevented from being deteriorated by making the second silicon oxide layer 12a positioned adjacent to the TFT layer 13.

A barrier layer B4 has a 5-layer structure that includes a silicon nitride layer, a silicon oxide layer, a silicon nitride layer, a silicon nitride layer, and a silicon oxide layer that are sequentially disposed on the flexible substrate FS.

Figure 5:
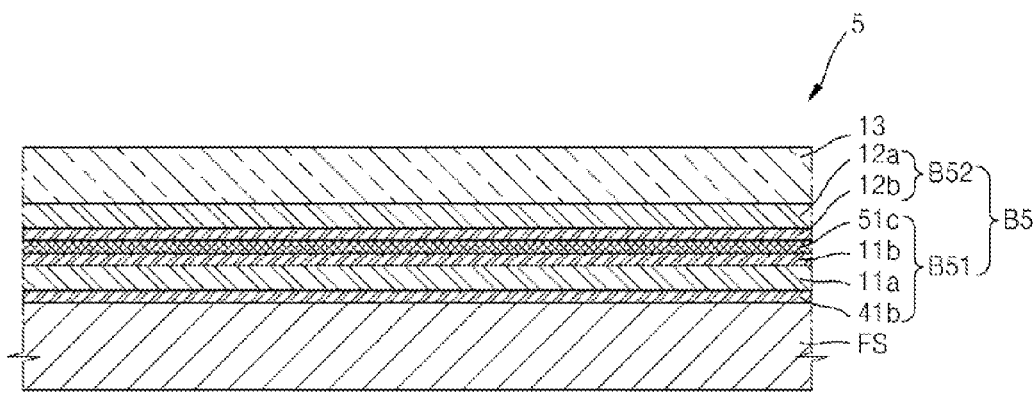
FIG. 5 is a cross-sectional view illustrating a TFT substrate according to an exemplary embodiment of the present invention.

FIG. 5 is a cross-sectional view illustrating a TFT substrate 5 according to an exemplary embodiment of the present invention.

Referring to FIG. 5, the TFT substrate 5 includes a flexible substrate FS, a first barrier layer B51, a second barrier layer B52, and a TFT layer 13.

The first barrier layer B51 includes a third silicon nitride layer 41b, a first silicon oxide layer 11a, a first silicon nitride layer 11b, and a second silicon oxynitride layer 51c.

The second barrier layer B52 includes a second silicon oxide layer 12a and a second silicon nitride layer 12b.

A barrier layer B5 of FIG. 5 is different from the barrier layer B4 of FIG. 4 in that the second silicon oxynitride layer 51c is further formed between the first silicon nitride layer 11b of the first barrier layer B51 and the second silicon nitride layer 12b of the second barrier layer B52. When a non-continuous process of forming the first barrier layer B51 on the flexible substrate FS in a first process chamber and forming the second barrier layer B52 in a second process chamber is performed, a surface of the first silicon nitride layer 11b that is an uppermost layer of the first barrier layer B51 is oxidized, and thus the second silicon oxynitride layer 51c is formed on the first silicon nitride layer 11b. Since the second oxynitride layer 51c may control moisture control, a water vapor transmission rate of the TFT substrate 5 may be reduced.

The first barrier layer B51 may be prevented from peeling off from the flexible substrate FS by increasing an adhesive force between the flexible substrate FS and the third silicon nitride layer 41b by increasing a preheating time of the flexible substrate FS. The characteristics of a TFT included in the TFT layer 13 may be prevented from being deteriorated by making the second silicon oxide layer 12a positioned adjacent to the TFT layer 13.

Figure 6:
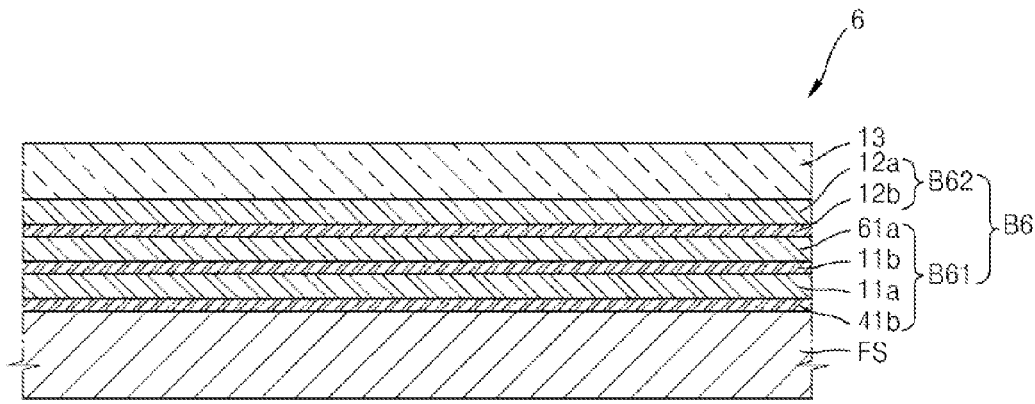
FIG. 6 is a cross-sectional view illustrating a TFT substrate according to an exemplary embodiment of the present invention.

FIG. 6 is a cross-sectional view illustrating a TFT substrate 6 according to an exemplary embodiment of the present invention.

Referring to FIG. 6, the TFT substrate 6 includes a flexible substrate FS, a first barrier layer B61, a second barrier layer B62, and a TFT layer 13.

The first barrier layer B61 includes a third silicon nitride layer 41b, a first silicon oxide layer 11a, a first silicon nitride layer 11b, and a fourth silicon oxide layer 61a.

The first barrier layer B61 of FIG. 6 is different from the first barrier layer B41 of FIG. 4 in that the fourth silicon oxide layer 61a is further formed between the first barrier layer B61 and the second barrier layer B62. Accordingly, a water vapor transmission rate of the TFT substrate 6 may be reduced by increasing a total thickness of the first barrier layer B61. The third silicon oxide layer 31a may be formed of substantially the same component as the first silicon oxide layer 11a. The third silicon oxide layer 31a may have substantially the same thickness as the first silicon oxide layer 11a. The fourth silicon oxide layer 61a may be formed of substantially the same component as the first silicon oxide layer 11a. The fourth silicon oxide layer 61a may have substantially the same thickness as the first silicon oxide layer 11a.

The second barrier layer B62 includes a second silicon oxide layer 12a and a second silicon nitride layer 12b. The characteristics of a TFT included in the TFT layer 13 may be prevented from being deteriorated by making the second silicon oxide layer 12a positioned adjacent to the TFT layer 13.

A barrier layer B6 has a 6-layer structure that includes a silicon nitride layer, a silicon oxide layer, a silicon nitride layer, a silicon oxide layer, a silicon nitride layer, and a silicon oxide layer that are sequentially disposed on the flexible substrate FS.

Figure 7:
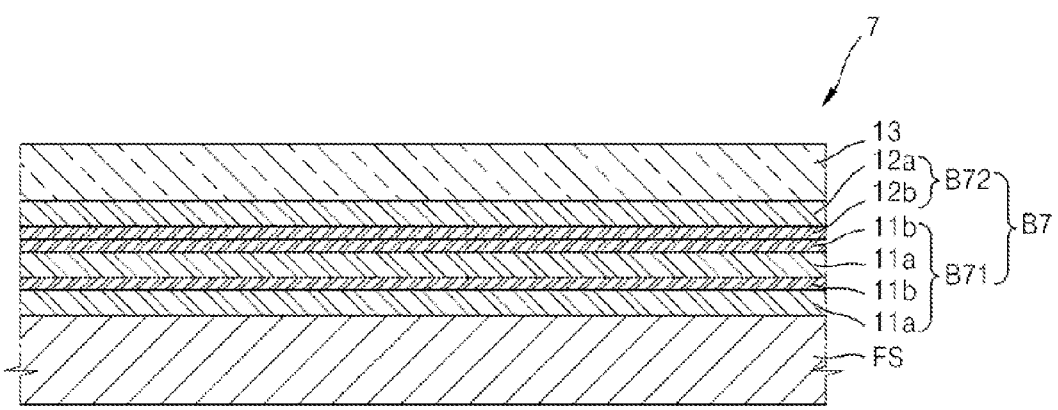
FIG. 7 is a cross-sectional view illustrating a TFT substrate according to an exemplary embodiment of the present invention.

FIG. 7 is a cross-sectional view illustrating a TFT substrate 7 according to an exemplary embodiment of the present invention.

Referring to FIG. 7, the TFT substrate 7 includes a flexible substrate FS, a first barrier layer B71, a second barrier layer B72, and a TFT layer 13.

The first barrier layer B71 has a 4-layer structure by alternately stacking the first silicon oxide layer 11a and the second silicon nitride layer 11b two times. Since the first silicon oxide layer 11a having a higher adhesive force than the first silicon nitride layer 11b is first formed on the flexible substrate FS, the first barrier layer B71 may be prevented from peeling off from the flexible substrate FS.

The first barrier layer B71 of FIG. 7 is different from the first barrier layer B11 of FIG. 1 in that two first silicon oxide layers 11a and two second first silicon nitride layers 11b are formed. Accordingly, a water vapor transmission rate of the TFT substrate 7 may be reduced by increasing a total thickness of the first barrier layer B71. The first silicon oxide layers 11a may have different components and thicknesses from each other. The first silicon nitride layers 11b may have different components and thicknesses from each other.

The second barrier layer B62 includes a second silicon oxide layer 12a and a second silicon nitride layer 12b. The characteristics of a TFT included in the TFT layer 13 may be prevented from being deteriorated by making the second silicon oxide layer 12a positioned adjacent to the TFT layer 13.

A barrier layer B7 has a 6-layer structure that includes a silicon oxide layer, a silicon nitride layer, a silicon oxide layer, a silicon nitride layer, a silicon nitride layer, and a silicon oxide layer that are sequentially disposed on the flexible substrate FS.

Figure 8:
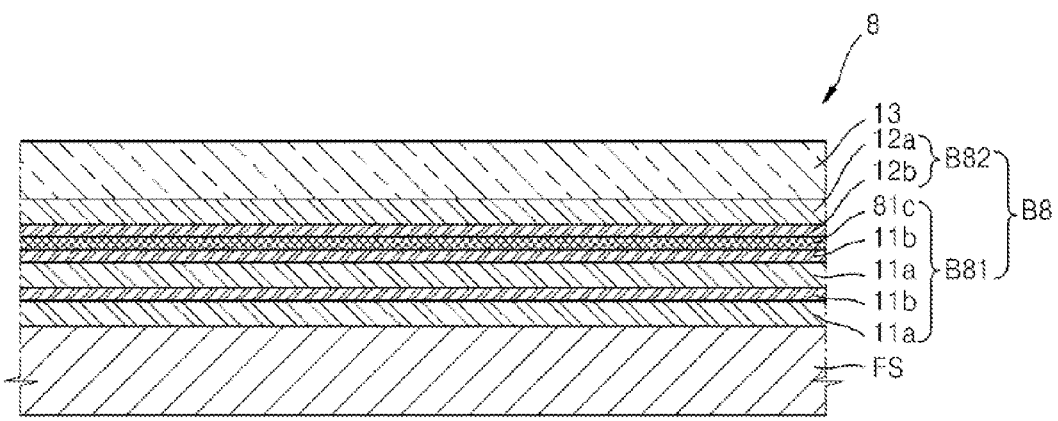
FIG. 8 is a cross-sectional view illustrating a TFT substrate according to an exemplary embodiment of the present invention.

FIG. 8 is a cross-sectional view illustrating a TFT substrate 8 according to an exemplary embodiment of the present invention.

Referring to FIG. 8, the TFT substrate 8 includes a flexible substrate FS, a first barrier layer B81, a second barrier layer B82, and a TFT layer 13.

The first barrier layer B81 includes two first silicon oxide layers 11a, two first silicon nitride layers 11b, and a third silicon oxynitride layer 81c.

The second barrier layer B82 includes a second silicon oxide layer 12a and a second silicon nitride layer 12b.

A barrier layer B8 of FIG. 8 is different from the barrier layer B7 of FIG. 7 in that the third silicon oxynitride layer 81c is further formed between the first silicon nitride layer 11b that is an uppermost layer of the first barrier layer B81 and the second silicon nitride layer 12b of the second barrier layer B52. When a non-continuous process of forming the first barrier layer B81 on the flexible substrate FS in a first process chamber and forming the second barrier layer B82 in a second process chamber is performed, a surface of the first silicon nitride layer 11b that is an uppermost layer of the first barrier layer B81 is oxidized, and thus the third silicon oxynitride layer 81c is formed on the first silicon nitride layer 11b. Since the third silicon oxynitride layer 81c may control moisture, a water vapor transmission rate of the TFT substrate 8 may be reduced.

The first barrier layer B81 may be prevented from peeling off from the flexible substrate FS by first forming the first silicon oxide layer 11a having a higher adhesive force than the first silicon nitride layer 11b on the flexible substrate FS.

The characteristics of a TFT included in the TFT layer 13 may be prevented from being deteriorated by making the second silicon oxide layer 12a positioned adjacent to the TFT layer 13.

Figure 9:
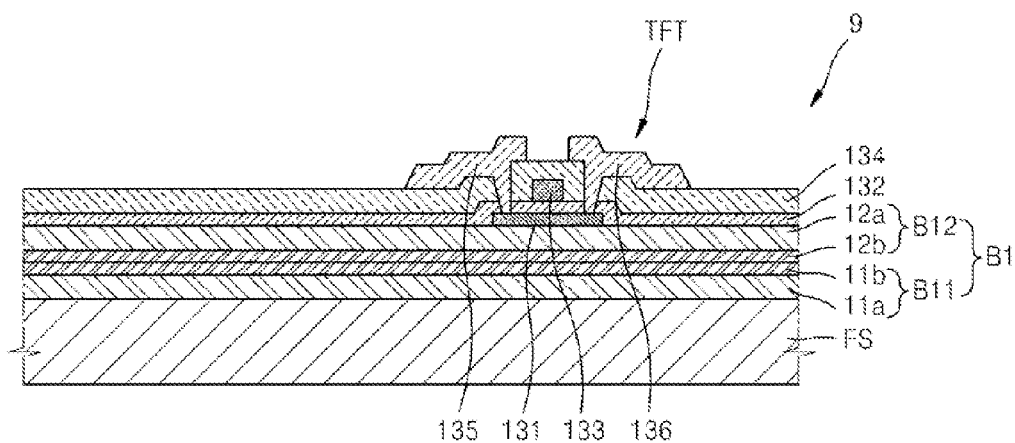
FIG. 9 is a cross-sectional view illustrating a TFT substrate according to an exemplary embodiment of the present invention.

FIG. 9 is a cross-sectional view illustrating a TFT substrate 9 according to an exemplary embodiment of the present invention.

Referring to FIG. 9, the TFT substrate 9 includes a flexible substrate FS, a first barrier layer B11, a second barrier layer B12, and a TFT.

The flexible substrate FS, the first barrier layer B11, and the second barrier layer B12 are the same as those of the TFT substrate 1 of FIG. 1. However, exemplary embodiments of the present invention are not limited thereto, and the TFT substrate of FIGS. 2 through 8 may be used as the TFT substrate 9.

Referring to FIG. 9, the TFT including a semiconductor layer 131, a gate electrode 133, a source electrode 136, and a drain electrode 135 is formed on the second barrier layer B12. A gate insulating film 132 is formed between the semiconductor layer 131 and the gate electrode 133, and an interlayer insulating film 134 is disposed between the gate electrode 133, and the source electrode 136, and the drain electrode 135. The semiconductor layer 131 may be formed of polycrystalline silicon (polysilicon) or amorphous silicon. The TFT may be an organic TFT or a conductive oxide TFT. A deterioration of characteristics of the TFT caused by a defect site included in the second silicon nitride layer 12b may be prevented by disposing the second silicon oxide layer 12a as an uppermost layer of the second barrier layer B12.

Although the TFT is a top gate TFT as shown in FIG. 9, exemplary embodiments of the present embodiment are not limited thereto. For example, various TFTs including a bottom gate TFT may be used as the TFT.

Figure 10:
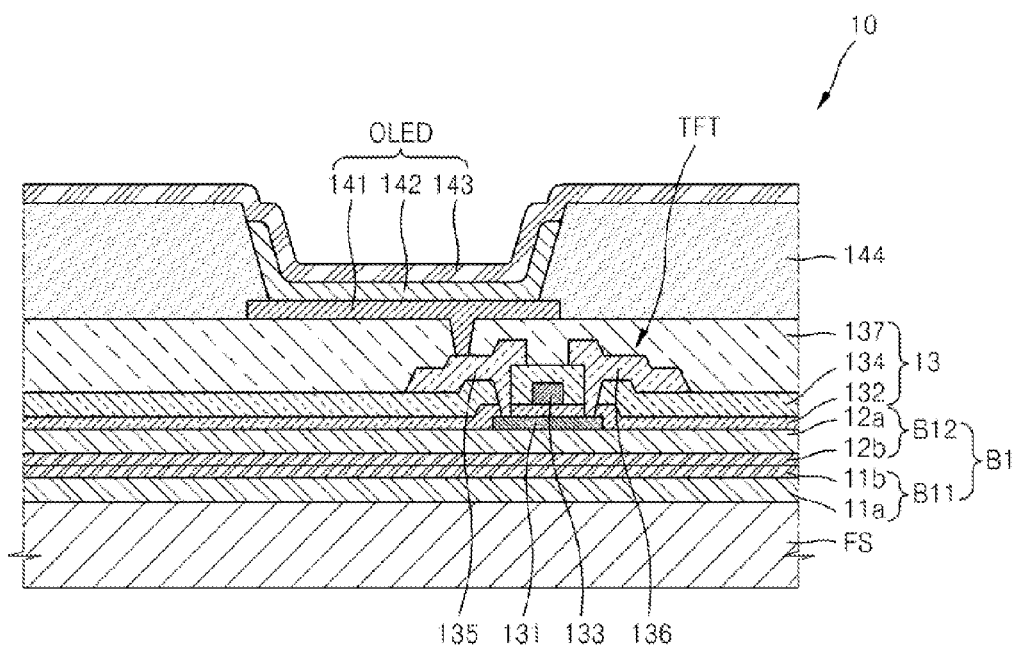
FIG. 10 is a cross-sectional view illustrating an organic light-emitting display device according to an exemplary embodiment of the present invention.

FIG. 10 is a cross-sectional view illustrating an organic light-emitting display device 10 according to an exemplary embodiment of the present invention.

Referring to FIG. 10, the organic light-emitting display device 10 includes a flexible substrate FS, a first barrier layer B11, a second barrier layer B12, a TFT layer 13, and an OLED.

The flexible substrate FS, the first barrier layer B11, and the second barrier layer B12 are substantially the same as those of the TFT substrate 9 of FIG. 9. However, exemplary embodiments of the present embodiment are not limited thereto. For example, the TFT substrate of FIGS. 2 through 8 may be used as the TFT substrate 9.

A TFT included in the TFT layer 13 is substantially the same as the TFT of FIG. 9. However, exemplary embodiments of the present embodiment are not limited thereto. Various TFTs including a bottom gate TFT may be used as the TFT. A poly-silicon TFT, an amorphous silicon TFT, an organic TFT, or a conductive oxide TFT may be used as the TFT.

A passivation layer 137 may be formed on the TFT, and a pixel defining layer 144 may be formed on the passivation layer 137. The passivation layer 137 may protect the TFT, and the passivation layer 137 may planarize a top surface of the TFT.

The OLED is connected to the drain electrode 135.

The OLED includes a pixel electrode 141, a counter electrode 143, and an intermediate layer 142 including at least an emission layer disposed between the pixel electrode 141 and the counter electrode 143. The intermediate layer 142 may be formed of a low molecular weight material or a high molecular weight material. When the intermediate layer 142 is formed of a low molecular weight material, the intermediate layer 142 may be formed as a single-layered structure or a multi-layered structure that includes a hole injection layer (HIL), a hole transport layer (HTL), an emission layer (EML), an electron transport layer (ETL), and an electron injection layer (EIL). When the intermediate layer 142 is formed of a high molecular weight material, the intermediate layer 142 may include an HTL and an EML.

The counter electrode 143 may be modified in various ways. For example, the counter electrode 143 may be shared by a plurality of pixels.

The pixel electrode 141 may function as an anode, and the counter electrode 143 may function as a cathode. Alternatively, the pixel electrode 141 may function as a cathode, and the counter electrode 143 may function as an anode. The pixel electrode 141 and/or the counter electrode 143 may be a transparent electrode through which light emitted from the emission layer may pass.

According to an exemplary embodiment of the present invention, at least one capacitor may be connected to the TFT. According to an exemplary embodiment of the present invention, an encapsulation member for encapsulating the OLED may be further provided. The encapsulation member may include one of a glass substrate, a metal substrate, or an encapsulation thin film 150 (see FIG. 11) including an inorganic film and/or an organic film.

Figure 11:
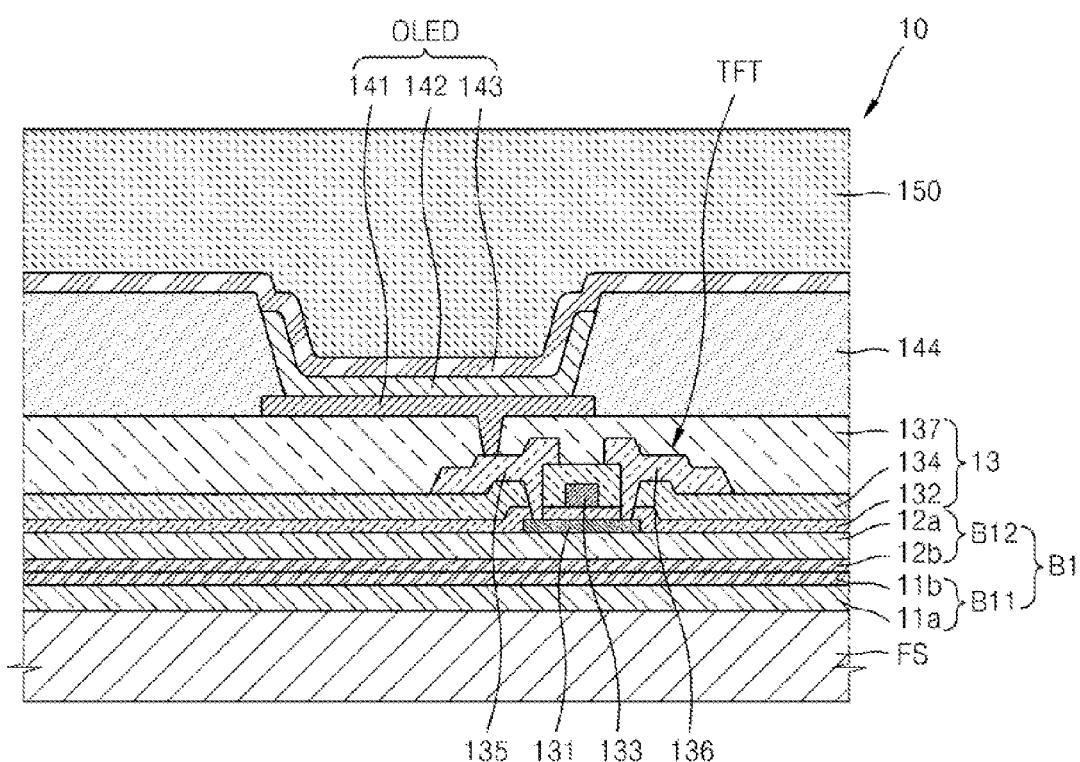
FIG. 11 is a cross-sectional view illustrating an organic light-emitting display device of FIG. 10 further including an encapsulation film, according to an exemplary embodiment of the present invention.

FIG. 11 is a cross-sectional view illustrating an organic light-emitting display device 10 including an encapsulation thin film 150, according to an exemplary embodiment of the present invention. The encapsulation thin film 150 may have a multi-layered structure. The encapsulation thin film 150 may include a plurality of inorganic layers, or the encapsulation thin film 150 may include a combination of an inorganic layer and an organic layer.

The organic layer may be formed of a polymer. For example, the organic layer may include a single-layered film or a multi-layered film that includes one of polyethylene terephthalate, polyimide, polycarbonate, epoxy, polyethylene, and/or polyacrylate. The organic layer may include polyacrylate. The organic layer may be formed of a material obtained by polymerizing a monomer composition including a diacrylate-based monomer and a triacrylate-based monomer. The monomer composition may further include a monoacrylate-based monomer. The monomer composition may further include a photoinitiator such as TPO, but exemplary embodiments of the present embodiment are not limited thereto.

The inorganic layer may be a single-layered structure or a multi-layered structure including metal oxide or metal nitride. The inorganic layer may include one of $SiN_x$, $Al_2O_3$, $SiO_2$, and $TiO_2$.

When the encapsulation thin film 150 has a multi-layered structure, an uppermost layer of the encapsulation thin film 150 which is exposed to the outside may be an inorganic layer, preventing moisture from penetrating into the OLED.

The encapsulation thin film 150 may include at least one sandwich structure that includes at least two inorganic layers, with at least one organic layer inserted therebetween. Alternatively, the encapsulation thin film 150 may include at least one sandwich structure that includes at least two organic layers with one inorganic layer inserted therebetween.

The encapsulation thin film 150 may include a first inorganic layer, a first organic layer, and a second inorganic layer that are sequentially formed on a top surface of the OLED. Alternatively, the encapsulation thin film 150 may include a first inorganic layer, a first organic layer, a second inorganic layer, a second organic layer, and a third inorganic layer that are sequentially formed on the top surface of the OLED.

Alternatively, the encapsulation thin film 150 may include a first inorganic layer, a first organic layer, a second inorganic layer, a second organic layer, a third inorganic layer, a third organic layer, and a fourth inorganic layer that are sequentially formed on the top surface of the OLED.

A halogenated metal layer including LiF may be further disposed between the OLED and the first inorganic layer. The halogenated metal layer may prevent the OLED from being damaged when the first inorganic layer is formed by using sputtering or plasma deposition.

The first organic layer has an area less than an area of the second inorganic layer, and the second organic layer may have an area less than an area of the third inorganic layer. The first organic layer may be substantially completely covered by the second inorganic layer, and the second organic layer may be substantially completely covered by the third inorganic layer.

Although the encapsulation thin film 150 is directly formed on the counter electrode 143 in FIG. 11, exemplary embodiments of the present embodiment are not limited thereto. Alternatively, an element such as a filler or an adhesive may be further disposed between the counter electrode 143 and the encapsulation thin film 150. An member such as a protective film may be further provided outside the encapsulation thin film 150 and/or the flexible substrate FS.

The number of silicon nitride layers and silicon oxide layers constituting a barrier layer of each TFT substrate may be increased from at least 2 to 6. The number of the silicon nitride layers and the silicon oxide layers may be equal to or higher than 7. However, as the number of silicon nitride layers and silicon oxide layers of a barrier layer is increased, a thickness of the barrier layer is increased. As the thickness of the barrier layer is increased, a water vapor transmission rate of a flexible substrate may be reduced, but the flexibility of the flexible substrate may be reduced. For example, in consideration of moisture resistance and warp prevention, a total thickness of the barrier layer may range from about 100 nm to about 2000 nm.

Although an organic light-emitting display device has been described as an example, exemplary embodiments of the present invention may be applied to various display devices other than the organic light-emitting display device.

According to the present invention, a water vapor transmission rate of a flexible substrate may be reduced and impurities may be prevented from penetrating into a TFT layer from the flexible substrate. Since an adhesive force with respect to the flexible substrate is increased, a barrier layer may be prevented from peeling off, and the characteristics of a TFT may be prevented from being deteriorated.

While the inventive concept has been shown and described with reference to exemplary embodiments thereof, it will be apparent to those of ordinary skill in the art that various changes in form and detail may be made thereto without departing from the spirit and scope of the inventive concept as defined by the following claims.

What is claimed is:

1. A thin-film transistor (TFT) substrate, comprising:
a flexible substrate;
a first barrier layer formed on the flexible substrate, the first barrier layer comprising a first silicon oxide layer and a first silicon nitride layer;
a second barrier layer formed on the first barrier layer, the second barrier layer comprising a second silicon oxide layer and a second silicon nitride layer;
a silicon oxynitride layer interposed between the first silicon nitride layer and the second silicon nitride layer; and
a TFT layer formed on the second barrier layer,
wherein the second silicon oxide layer is disposed closer to the TFT layer than the first silicon oxide layer, wherein the first silicon nitride layer and the second silicon nitride layer are interposed between the first silicon oxide layer and the second silicon oxide layer,
wherein the first silicon nitride layer is in contact with the second silicon nitride layer, and
wherein a total thickness of the first and second silicon nitride layers is less than a total thickness of the first and second silicon oxide layers.

2. The TFT substrate of claim 1, wherein the first silicon oxide layer is in contact with the flexible substrate, and the first silicon nitride layer of the first barrier layer is in contact with the first silicon oxide layer.

3. The TFT substrate of claim 1, further comprising a silicon nitride layer interposed between the flexible substrate and the first silicon oxide layer.

4. The TFT substrate of claim 3, further comprising a silicon oxynitride layer between the first silicon nitride layer and the second silicon nitride layer.

5. The TFT substrate of claim 3, wherein the silicon oxide layer is in contact with the flexible substrate, and the silicon nitride layer is in contact with the silicon oxide layer.

6. The TFT substrate of claim 5, further comprising a silicon oxynitride layer between the first silicon nitride layer and the second silicon nitride layer.

7. The TFT substrate of claim 1, wherein each of the first and second barrier layers further includes one or more silicon oxide layers and one or more silicon nitride layers.

8. An organic light-emitting display device, comprising:
a flexible substrate;
a first barrier layer formed on the flexible substrate, the first barrier layer comprising a first silicon oxide layer and a first silicon nitride layer;
a second barrier layer formed on the first barrier layer, the second barrier layer comprising a second silicon oxide layer and a second silicon nitride layer;
a silicon oxynitride layer interposed between the first silicon nitride layer and the second silicon nitride layer;
a thin-film transistor (TFT) formed on the second barrier layer; and
an organic light-emitting layer formed on the second barrier layer, the organic light-emitting layer connected to the TFT,
wherein the first silicon nitride layer is in contact with the second silicon nitride layer, and
wherein the first silicon oxide layer of the first barrier layer is disposed on the flexible substrate, and the first silicon nitride layer of the first barrier layer is disposed on the first silicon oxide layer of the first barrier layer, and wherein the second silicon nitride layer of the second barrier layer is in contact with the first barrier layer, and the second silicon oxide layer of the second barrier layer is disposed on the second silicon nitride layer of the second barrier layer.

9. The organic light-emitting display device of claim 8, further comprising a silicon oxynitride layer between the first silicon nitride layer and the second silicon nitride layer.

10. The organic light-emitting display device of claim 8, further comprising a silicon nitride layer disposed between the flexible substrate and the first silicon oxide layer.

* * * * *